United States Patent [19]

Mastroianni et al.

[11] 4,443,932

[45] Apr. 24, 1984

[54] SELF-ALIGNED OXIDE ISOLATED PROCESS AND DEVICE

[75] Inventors: Sal Mastroianni, Mesa; Walter F. Krolikowski, Scottsdale, both of Ariz.

[73] Assignee: Motorla, Inc., Schaumburg, Ill.

[21] Appl. No.: 339,954

[22] Filed: Jan. 18, 1982

[51] Int. Cl.$^3$ .................... H01L 21/316; H01L 21/76
[52] U.S. Cl. ............................. 29/576 W; 29/577 C; 29/578; 29/580; 148/187; 156/653; 156/657; 156/662; 357/50
[58] Field of Search ................ 29/576 W, 577 C, 578, 29/580; 148/187; 156/653, 657, 662; 357/50

[56] References Cited

U.S. PATENT DOCUMENTS

| Re. 30,282 | 5/1980 | Hunt et al. | 148/187 X |
|---|---|---|---|
| T918,008 | 1/1974 | Brack et al. | 357/50 X |
| 3,560,278 | 2/1971 | Sanera | 148/187 |
| 3,783,047 | 1/1974 | Paffen et al. | 148/187 |
| 3,833,429 | 9/1974 | Monma et al. | 29/578 X |
| 3,847,687 | 11/1974 | Davidsohn | 148/187 |
| 3,948,694 | 4/1976 | Mills | 148/187 |
| 3,958,040 | 5/1976 | Webb | 29/578 X |
| 4,135,954 | 1/1979 | Chang et al. | 29/578 X |
| 4,252,582 | 2/1981 | Anantha et al. | 148/175 |
| 4,271,583 | 6/1981 | Kahng et al. | 148/187 X |

*Primary Examiner*—W. G. Saba
*Attorney, Agent, or Firm*—Robert M. Handy

[57] ABSTRACT

Improved self-aligned semiconductor devices are made using two sets of superposed pattern forming layers; a master mask layer set containing the self-aligned patterns, and a pattern selector layer set which allows different apertures in the master mask layer to be selectively re-opened so that different device regions may be sequentially formed. The master mask layer is a double layer of a first material resistant to typical device forming processes, covered by a second etch stop material. The selector layer may be a single process resistant material or a double layer. Using combinations of silicon oxide and nitride, the process is applied to the formation of silicon islands with emitters and emitter, base, and collector contacts self-aligned to each other and a surrounding oxide isolation region. Significant area and cost savings are achieved without additional masking steps or precision alignments.

9 Claims, 21 Drawing Figures

SELF-ALIGNED OXIDE ISOLATED PROCESS AND DEVICE

BACKGROUND OF THE INVENTION

1. Field of Invention

This invention relates, in general, to means and methods for improved semiconductor devices and integrated circuits, and more particularly, to an improved self-aligned manufacturing process which is especially useful for dielectrically, (e.g. oxide) isolated structures, and to devices and circuits made thereby.

2. Background Art

Semiconductor devices and integrated circuits (IC's) are commonly made by creating a variety of doped regions in a semiconductor wafer substrate. The lateral geometry and position of the doped regions are fixed by successive masking operations. Each new mask layer must be aligned with the pattern created by the prior mask layer so that the device regions being added will register with those already in place. Since the alignment process is not perfect, some space is wasted in providing the needed alignment tolerance. This wasted space is increasingly important as the minimum dimensions of the device or IC structure shrink. It is common now to utilize device and circuit features whose minimum dimensions are of the order of 1–2 microns or less. When the alignment tolerance is even a fraction of a micron, substantial space is wasted.

This problem is particularly severe with dielectrically isolated devices and circuits. In these structures, the active device regions are placed in an island of semiconductor material which is surrounded laterally by a thick dielectric region. The island and the dielectric region are typically formed in the same wafer substrate. The dielectric region reduces the parasitic capacity and coupling between adjacent devices and permits higher frequency and lower power operation to be achieved. For silicon bipolar devices, a thick thermal oxide region is often used to form the dielectric isolation. The active device regions must be aligned with respect to this isolation region. In the past, two or more separate masks have been used to do this, each one requiring extra space for the alignment tolerance. While past efforts to achieve self-aligned device structures, as exemplified by U.S. Pat. Nos. 3,560,278 and No. Re 30,282, have proved useful where metallized or doped device areas were required, they have not proved practical for self-aligned device structures involving oxide isolation regions or the like. This is because the prior art structures and methods have not been compatible with the processes required to form dielectric isolation regions or the like. To overcome this limitation, it has been necessary with the prior art, to use additional masking steps or additional processing steps and materials. These additional steps result in significantly lower manufacturing yields and higher costs. Thus, a need has continued to exist for an improved self-aligned manufacturing process for electronic devices and circuits, particularly, a self aligned process adapted to the manufacture of dielectrically isolated semiconductor structures.

Accordingly, it is an object of this invention to provide an improved process for manufacturing semiconductor and other solid state devices and integrated circuits wherein a device region must be laterally self-aligned with respect to a dielectric isolation region.

It is an additional object of this invention to provide an improved process for manufacturing dielectrically isolated devices and circuits having more compact lateral dimensions.

It is a further object of this invention to provide an improved process for manufacturing semiconductor devices and integrated circuits in which device regions, such as the emitter and the emitter, base, and/or collector contacts, can be positioned laterally within another device region and automatically aligned with respect to each other and to the other device region, particularly a dielectric isolation region.

It is an additional object of this invention to provide an improved process for manufacturing semiconductor devices and integrated circuits of more compact dimensions by eliminating the alignment tolerance presently required to position device regions, such as the emitters and the emitter, base, and/or collector contacts, within the active semiconductor region of, for example, a non-walled emitter dielectrically isolated structure.

It is a further object of the present invention to provide an improved manufacturing process for eemiconductor and other solid state devices and integrated circuits, wherein dielectric isolation regions are self-aligned with other device regions by means of multiple oxide and nitride layers, wherein these layers are arranged so as to conveniently permit selective etching using oxide attacking etchants and nitride attacking etchants, and wherein the process is compatible with the use of organic resists for patterning.

It is an additional object of the present invention to provide an improved manufacturing process for semiconductor and other solid state devices and integrated circuits which achieves the above objects without additional alignment steps or adverse effects on manufacturing yield.

It is a yet additional object of this invention to provide improved semiconductor and solid state devices and integrated circuits made by the process of this invention.

SUMMARY OF THE INVENTION

In a preferred embodiment of the invention, a substrate surface is first optionally coated with a thin buffer layer, and then coated with a first pattern forming (master-mask) layer composed of a two part sandwich, the first part being an oxidation and doping resistant layer (sub-master-mask), the second part being a first etch resistant (etch stop) layer. The first etch resistant layer must withstand etchants which attack the oxidation and doping resistant layer, but be otherwise etchable. The buffer layer remains on the substrate surface until a device region is to be formed, whereupon it is locally removed. A pattern is formed in the first pattern forming (master-mask) layer having at least two openings penetrating to the buffer layer on the substrate surface. The two openings are located a predetermined distance apart. This predetermined distance takes into account any undercut amounts by which the device regions placed in or on the substrate diffuse or grow laterally during formation, and determines the relative placement of the two self-aligned device regions which are to be formed using the above two openings as mask apertures.

A second pattern forming (selector) layer composed of an oxidation resistant layer, and preferably covered by a second etch resistant layer, is formed on the first pattern forming layer, covering the first layer and the portion of the buffer layer exposed in the two prior openings. The second etch resistant layer must resist etchants which attack the oxidation resistant layer but be otherwise etchable. An aperture is formed in the second pattern forming (selector) layer, roughly aligned over a first of the two prior openings in the first pattern forming layer. In doing this, the second etch resistant layer is first patterned, typically using a resist, and then used as a mask to etch the underlying oxidation resistant layer. The aperture in the second pattern forming layer is larger than and encompasses the first opening so that no precision alignment is needed. Removal of the second pattern forming layer material within this aperture re-exposes the buffer layer surface in the first opening. A non-patterned etch is used to remove the buffer layer in this opening, exposing the substrate surface in the first opening. The first opening is then used as a mask pattern to define a dielectric isolation or other oxidized region in the substrate surface. After forming the dielectric isolation or other oxidized region under the first opening, the remainder of the second pattern forming layer is removed, re-exposing the buffer layer surface in the second opening in the first pattern forming layer. A non-patterned etch is used to remove the buffer layer in this opening, exposing the substrate surface. This opening is then used as a mask pattern to define a second device region by doping, oxidation or otherwise. As a result of this procedure, the device regions defined through the openings in the master mask layer are self-aligned a predetermined distance apart. One or both device regions can be a dielectric isolation region.

Devices made using the process have smaller area and lower cost. In alternative, though less convenient embodiments, the buffer layer and second etch resistant layer are omitted.

DETAILED DESCRIPTION OF THE PREFERRED EMBODIMENTS

Figure 1A:
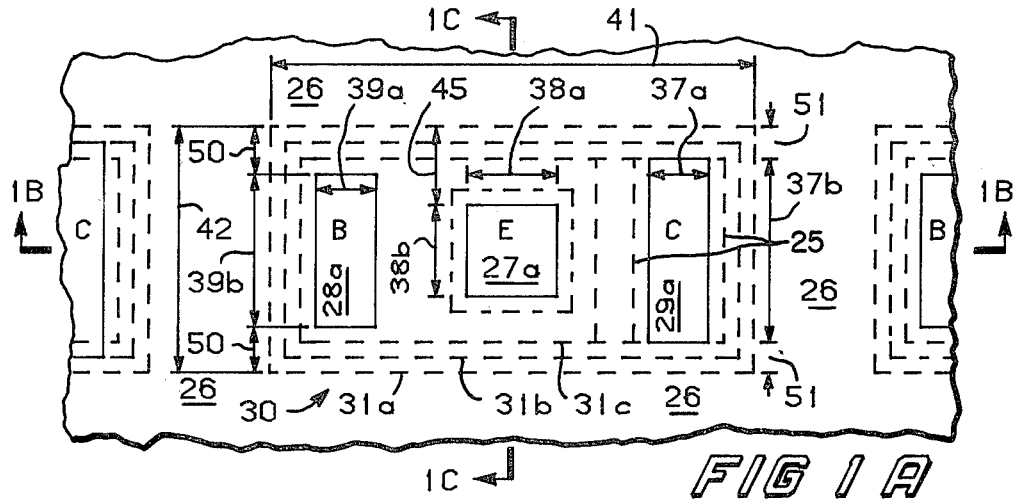
FIG. 1A is a top view of a portion of a dielectrically isolated bipolar integrated circuit and device showing the layout in simplified form.
Figure 1B:
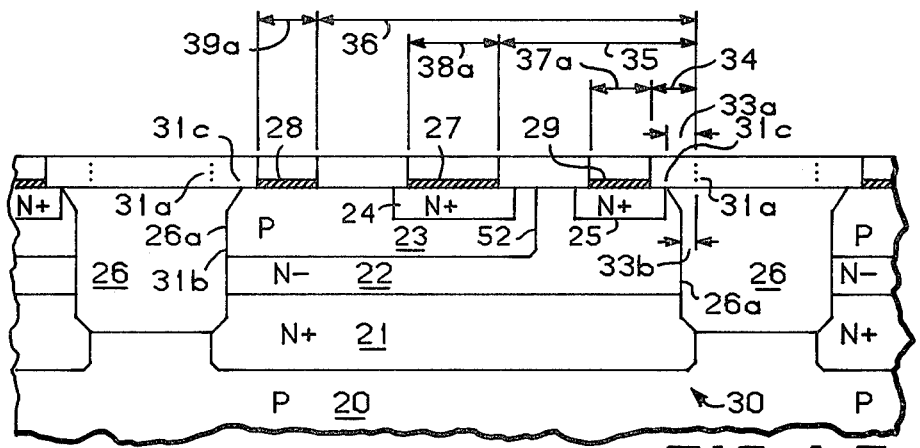
FIG. 1B is a cross section in simplified form of the device of FIG. 1A.
Figure 1C:
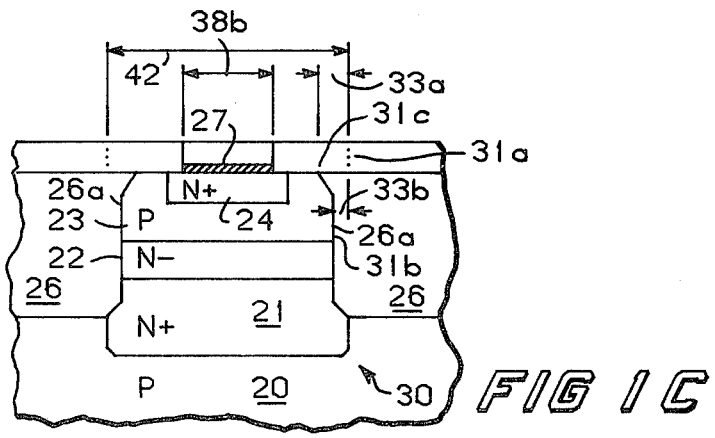
FIG. 1C is another cross section in simplified form of the device of FIG. 1A.

FIGS. 1A-C show a portion of a dielectrically isolated bipolar integrated circuit. FIG. 1A is a top view and FIGS. 1B and 1C are cross sections. For simplicity, only the principal features of the structure have been shown. Semiconductor substrate 20 has formed therein buried collector region 21, collector region 22, base region 23, emitter region 24, collector contact region 25, and dielectric isolation region 26. In a typical circuit or device using silicon semiconductor material, dielectric isolation region 26 will be formed from silicon oxide. Emitter region 24, base region 23, and collector contact region 25 are contacted by emitter contact 27, base contact 28 and collector contact 29 respectively. It will be apparent to those of skill in the art that the conductivity types shown in regions 20-25 of FIGS. 1B-1C are for purposes of illustration, and that other combinations and arrangements of conductivity types and devices types could also be used.

It is apparent in FIGS. 1A-1C that semiconductor region 30 in which device regions 21-25 are formed has the appearance of an "island" of perimeters 31a-c surrounded by a "sea" of isolation region 26. Perimeter 31a corresponds to the mask opening used to produce isolation region 26, perimeter 31b corresponds to the perimeter associated with side walls 26a of isolation region 26, and perimeter 31c corresponds to the perimeter of isolation region 26 at the semiconductor surface. Perimeter 31c lies within perimeter 31a by undercut amount 33a which represents the amount by which isolation region 26 spreads laterally at the surface during formation. Perimeter 31b lies within perimeter 31a by undercut amount 33b which represents the amount by which sidewalls 26a of isolation region 26 spread laterally during formation. Undercut amount 33a exceeds undercut amount 33b.

It is desirable to minimize lateral dimensions 41-42 required for island 30. This is best achieved by arranging for emitter opening 27a and base and collector contact openings 28a and 29a to be self-aligned with respect to perimeter 31a-c of isolation region 26. This permits spacings 34-36, 45, and 50-51 to have their minimum values with no allowance for alignment. It is desirable but not essential that emitter contact opening dimensions 38a-b, base contact opening dimensions 39a-b, and collector contact opening dimensions 37a-b also be made as small as possible. This is usually done.

Substantial area and cost savings are achieved by use of the self-aligned process of this invention, as compared to a process which is not self-aligned. For example, in structures having about 2 micrometer minimum feature size, dimension 41 is reduced by about 16% and dimension 42 by about 30% when the self-aligned process of the present invention is used. This provides an area saving of 40%. Other things being equal, this can result in an approximately 40% increase in die count per wafer and a corresponding decrease in the cost per die.

In FIGS. 1A-1C, emitter region 24 and emitter contact 27 do not extend laterally to intersect isolation perimeter 31c. Base region 23 extends to intersect perimeter 31c. Base and collector contacts 28 and 29, respectively, can extend to intersect perimeter 31c, although it is preferable that they do not. In FIG. 1A, collector contact 25 and collector contact opening 29a are illustrated as intersecting perimeter 31c, while base contact opening 28a is illustrated as not intersecting perimeter 31c in order that the difference may be easily visualized. The structure illustrated in FIG. 1A is referred to as a non-walled emitter, signifying that emitter 24 does not intersect wall 26a of isolation region 26 but is spaced inside perimeter 31a by lateral distance 45. A walled emitter structure is one in which the emitter region extends to and intersects sidewall 26a of isolation region 26. A self-aligned process for producing non-walled emitters is particularly desirable, since it provides a packing density closely approaching that of walled emitter structures, but without their manufacturing yield problems, e.g., channeling along isolation wall 26a.

Figure 2A:
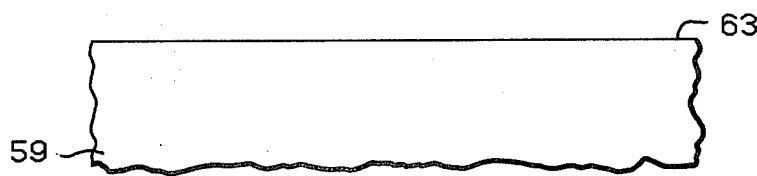
FIGS. 2A-H are cross sections in simplified and idealized form of a portion of a self-aligned semiconductor device at different stages of manufacture, according to the prior art.
Figure 2B:
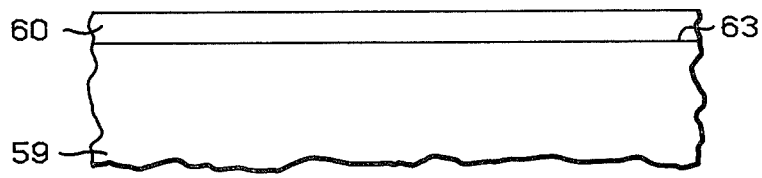
Figure 2C:
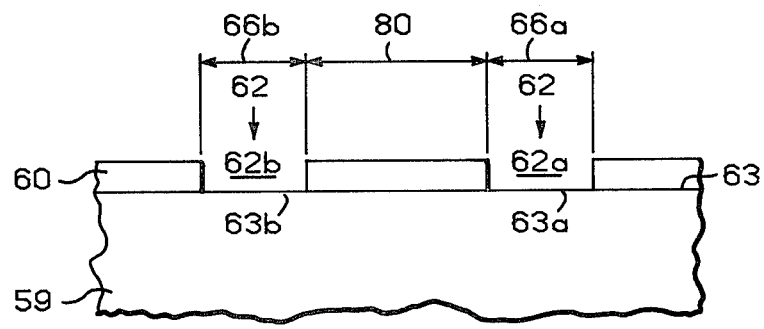
Figure 2D:
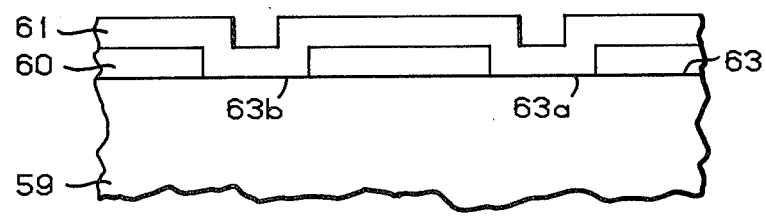
Figure 2E:
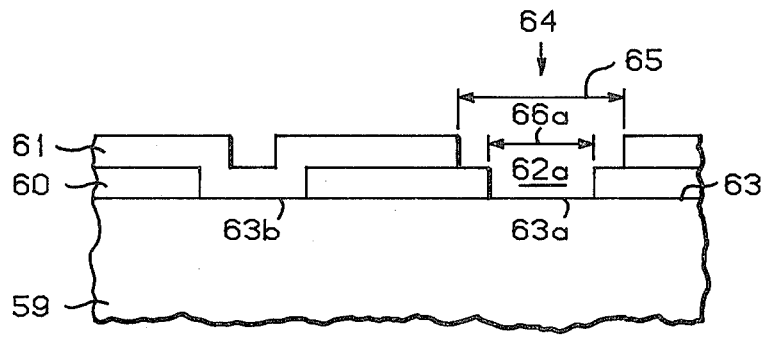
Figure 2F:
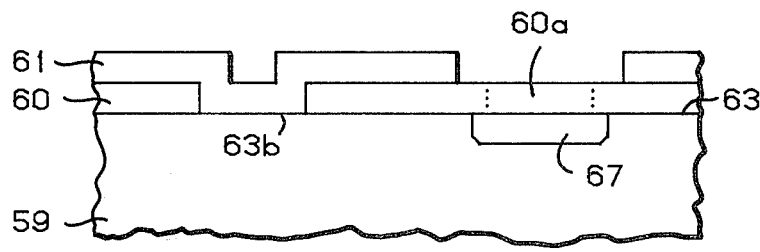
Figure 2G:
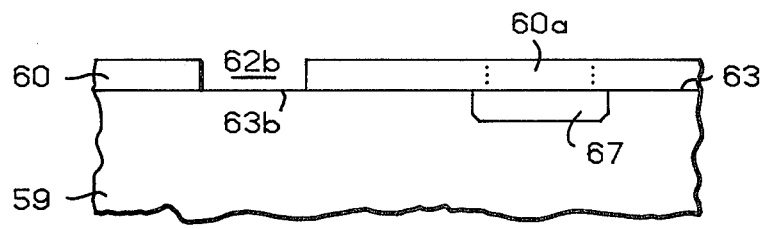
Figure 2H:
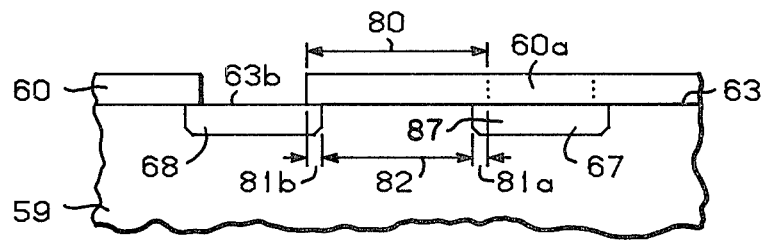

FIGS. 2A-H illustrate the practice of a method of obtaining self aligned doped regions according to the prior art. In FIGS. 2A-C, semiconductor portion 59 has first pattern forming layer 60 applied to principal surface 63. First pattern forming layer 60 is called the "master-mask" layer because it defines the critical device regions (via pattern 62) which are to be self-aligned. Master-mask pattern 62 having openings 62a–b of widths 66a–b is formed (FIG. 2C) in first pattern forming layer 60. Openings 62a–b are separated by predetermined distance 80. Openings 62a–b generate to semiconductor surface 63, so that surface portions 63a–b corresponding to openings 62a–b are exposed. Second pattern forming layer 61 is applied (FIG. 2D) over first pattern forming layer 60 and in the openings 62a–b to cover exposed silicon surfaces 63a–b. Second pattern forming layer 61 is called the "selector" layer because it permits the individual openings in master-mask layer 62 to be selected and sequentially opened for separate device processing, without critical alignment steps. Second pattern 64 of opening width 65 is formed (FIG. 2E) in second pattern forming (selector) layer 61. Width 65 of pattern 64 must be larger than width 66a of original opening 62a, so that pattern 64 can be easily aligned without critical tolerance to entirely cover original opening 62a. Forming pattern 64 in layer 61 re-exposes surface portion 63a in original opening 62a. Original opening 62a is now used (FIG. 2F) as a mask aperture to define doped device region 67. Following doping, region 60a of layer 60 is reformed in opening 62a.

Second pattern forming (selector) layer 61 is now removed (FIG. 2G) from the remainder of the surface, re-exposing silicon surface region 63b in original opening 62b. First pattern forming (master-mask) layer 60 can now be used (FIG. 2H) as a mask to define device region 68 under opening 62b, for example, by doping the semiconductor by diffusion or implantation. It will be observed that separation 82 of device regions 67–68 is determined, by separation distance 80 of openings 62a–b in first pattern forming layer 60, minus undercut amounts 81a–b, and that alignment is automatic. Since openings 62a–b were formed from a single mask, device regions 67–68 are self-aligned.

In order to carry out the process described above it is essential that the first and second pattern forming layers (master-mask and selector layers) be made from materials having different etching characteristics so that one or more portions of the second pattern forming (selector) layer may be removed without substantially etching the first pattern forming (master-mask) layer. Additionally, both pattern forming layers 60 and 61 must be made from materials which act as masks during doping of regions 67–68. It is well known in the art that silicon oxide and silicon nitride form a set of materials having these properties, that is, having substantially separate etching chemistries and the ability to act as diffusion or implantation barriers. Layer 60 is formed from silicon oxide and layer 61 from silicon nitride. This permits region 60a to be formed from oxide, regrown after doping of region 67. Region 60a then acts as a barrier to further doping in region 67 during doping of region 68.

While the prior art method and material configuration work satisfactorily when device regions 67 and/or 68 are to be doped, they are not useful if it is desired that one or both regions be a dielectric isolation region. The reason for this is that dielectric isolation regions are typically formed by oxidation of the underlying substrate. It is not possible to use an oxide layer (e.g. layer 60) as a mask to define the lateral extent of an oxide region of comparable thickness, since oxidation would proceed through the oxide layer as well as in areas where the bare substrate (semiconductor) was exposed. Thus, aperture 62a would not be effective in delineating a dielectric (oxide) isolation region in location 87 in place of doped region 67 since the definition and self-alignment features would be lost. The problem is not avoided by interchanging the order of the layers, that is, by making layer 60 from nitride and layer 61 from oxide. In this case, an attempt to grow an oxide dielectric isolation region in surface 63a through aperture 62a of FIG. 2E would also result in oxidation of surface 63b through layer 61 in opening 62b. To form self-aligned device regions where one or more regions require an oxidation step, a different method and material combination is required wherein pattern forming layers 60 and 61 are both substantially impervious to oxidation. Additionally, where doped regions are required, at least one pattern forming layer must also be resistant to doping. This is accomplished by the invented combination and process illustrated in FIGS. 3A–J.

FIGS. 3A–J illustrate the practice of a preferred embodiment of the method of this invention. In this description, a silicon substrate and NPN bipolar devices are used by way of illustration. It will be recognized by those of skill in the art that the method applies to other materials, devices, and conductivity types as well.

Figure 3A:
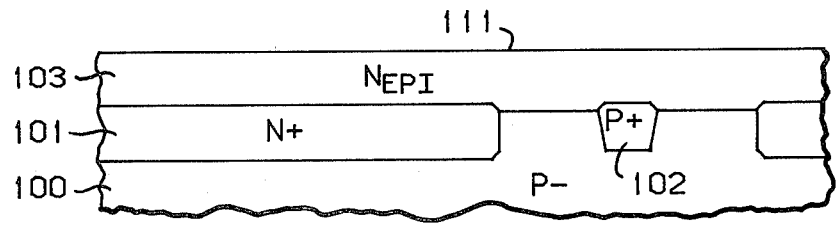
FIGS. 3A-J are cross sections in simplified form of a portion of a self-aligned semiconductor device at different stages of manufacture, according to the method of the present invention.
Figure 3B:
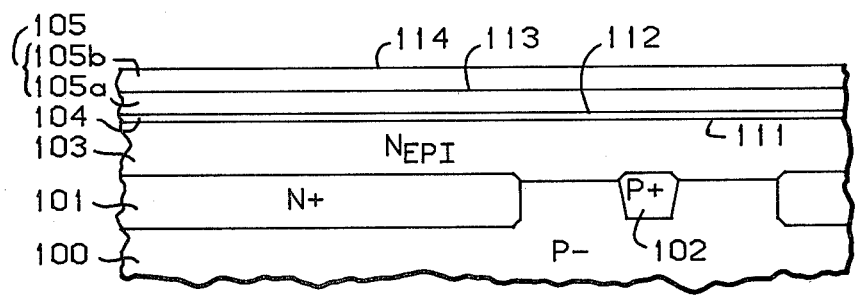
Figure 3C:
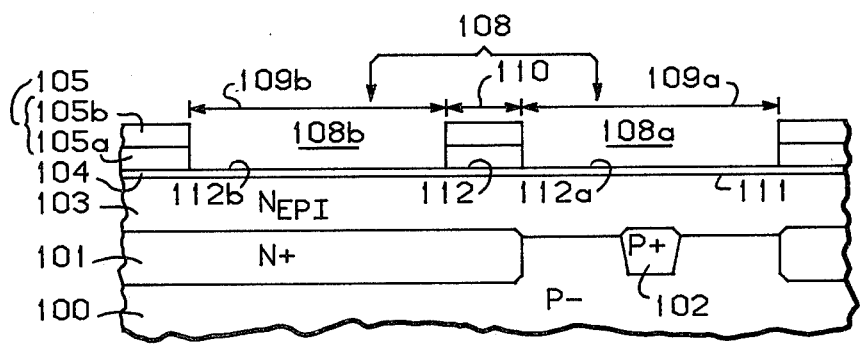
Figure 3D:
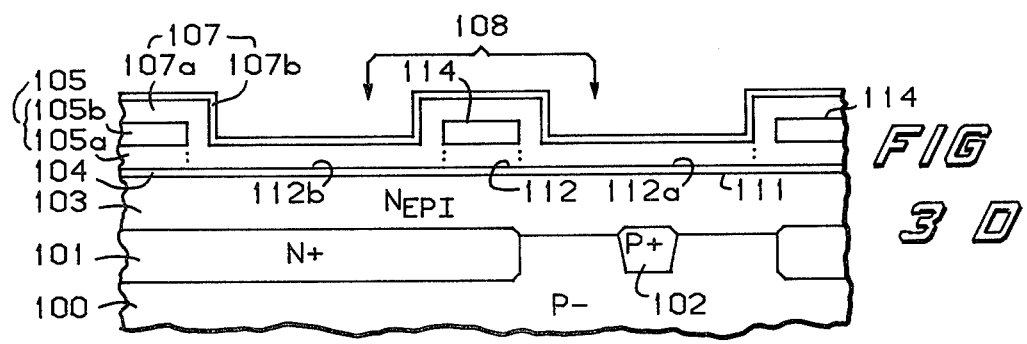

In FIGS. 3A–J, silicon semiconductor substrate portion 100 comprises buried collector 101, buried channel stop 102, epitaxial collector region 103, and principal surface 111. In FIG. 3B, buffer layer 104 having surface 112 and comprising typically silicon dioxide is applied to silicon surface 111. Buffer layer 104 serves as a chemical and physical separator and matching layer between silicon surface 111 and first pattern forming layer 105. First pattern forming (master-mask) layer 105 is applied over buffer layer 104 and comprises two superposed layers; device process resistant (sub-master-mask) layer 105a of typically silicon nitride having surface 113, and first etch resistant (etch stop) layer 105b of typically silicon oxide having surface 114. First (master-mask) pattern 108 is formed (FIG. 3C) in layers 105b and 105a using masking and etching techniques to be subsequently described. First pattern 108 has at least two openings 108a–b of widths 109a–b, respectively, and separation 110. Formation of first pattern 108 exposes portions 112a–b of surface 112 of layer 104.

As used herein "master-mask" layer (e.g. 60 or 105) and "sub-master mask" layer (e.g. 105a) refer to those layers or combinations of layers which, through their resistance to device forming processes, such as oxidation, doping, alloying, metallizing, and so forth, provide the delineation of the critical device regions to be self-aligned. "Selector layer" refers to that layer (e.g. 61 of FIG. 2) or combinations of layers (e.g. 107 of FIG. 3) which through their selective etch properties allow re-exposure of one or more openings in the master-mask layer.

Figure 3E:
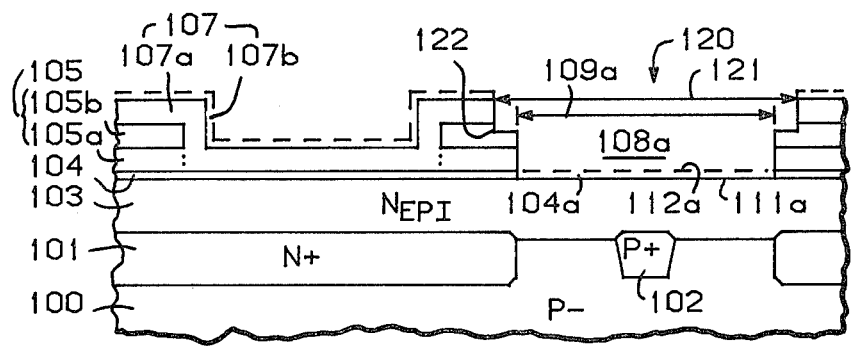

Second pattern forming (selector) layer 107 composed of oxidation resistant layer 107a of typically silicon nitride and, preferably but not essentially, second etch resistant layer 107b of typically silicon oxide is applied (FIG. 3D) to surface 114 of layer 105a and to surface portions 112a–b of layer 104 in prior openings 108a–b. Oxide layer 107b provides an etch mask layer for convenient etching of oxidation resistant layer 107a. In FIG. 3E, second (selector) pattern 120 of width 121 is formed in second pattern forming (selector) layer 107. Width 121 of pattern 120 must be larger than width 109a of original opening 108a, so that pattern 120 may be easily aligned without critical tolerance to entirely cover original opening 108a. Forming pattern 120 in layer 107 re-exposes surface portion 112a of buffer layer layer 104. Second pattern 120 is formed by masking and etching methods to be subsequently described. A non-patterned etch is used to remove portion 104a of layer 104 exposed in opening 108a, thereby exposing silicon substrate surface portion 111a. The non-patterned etch also produces a slight thinning of oxide layer 105b in region 122 and substantially removes layer 107b. No masking step is required.

Figure 3F:
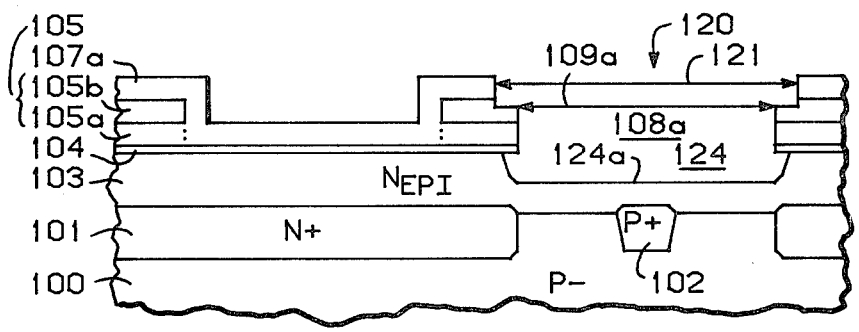
Figure 3G:
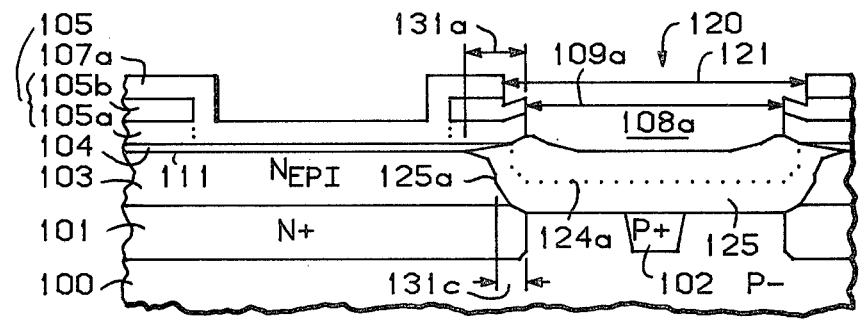
Figure 3H:
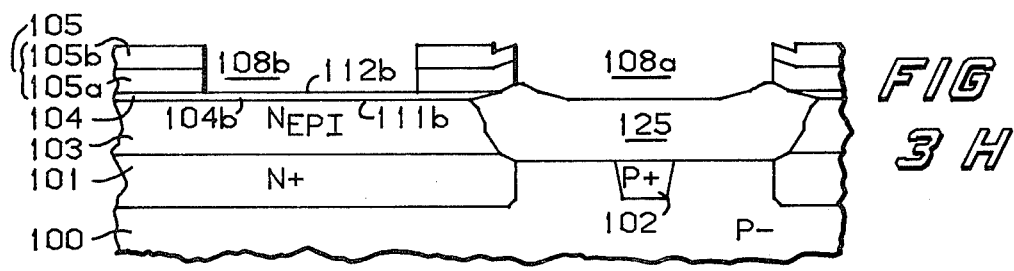
Figure 3I:
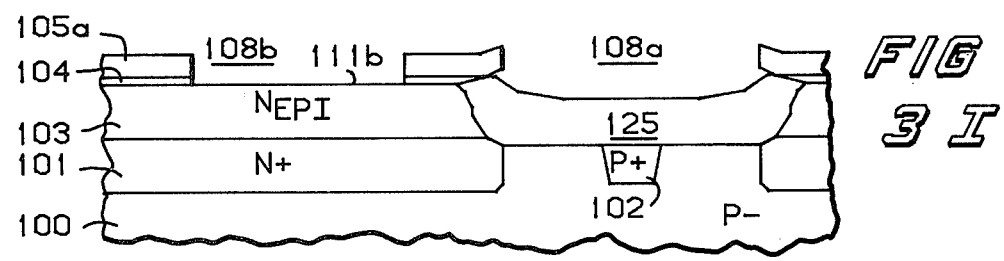

FIGS. 3F–G illustrate the formation of dielectric oxide isolation region 125. Moat 124 is etched in silicon substrate region 103 using opening 108a to define the desired location and shape. Surface 124a of moat 124 is oxidized to produce dielectric oxide isolation region 125 by techniques well known in the art. Oxidation and doping resistant layer 105a and oxidation resistant layer 107a act as masks during growth of oxide region 125. Sidewalls 126a of dielectric oxide isolation region 125 grow laterally, undercutting mask opening 108a by undercut amount 131a at the substrate surface 111 and undercut amount 131c in the bulk of the semiconductor. Procedures for creating dielectric oxide isolation regions are well known in the art. As will be subsequently described, the thickness of layers 104, 105 and 107 must be properly chosen to be ccompatible with the requirements for forming a dielectric isolation region by thermal oxidation of the silicon, or other means, and to withstand the several etching steps.

Following creation of dielectric oxide isolation region 125, the remaining portion (107a) of second pattern forming layer 107 is removed (FIG. 3H) by non-patterned etching, no masking step being required. This re-exposes surface portion 112b of prior opening 108b. Region 104b of layer 104 is removed in FIG. 3I by non-patterned etching to expose surface portion 111b of silicon substrate surface 111 in preparation for creation of a device region by doping or other means. The remaining portions of oxide layer 105b are substantially removed at the same time. A slight thinning of region 125 also occurs at the same time. No masking step is required.

Figure 3J:
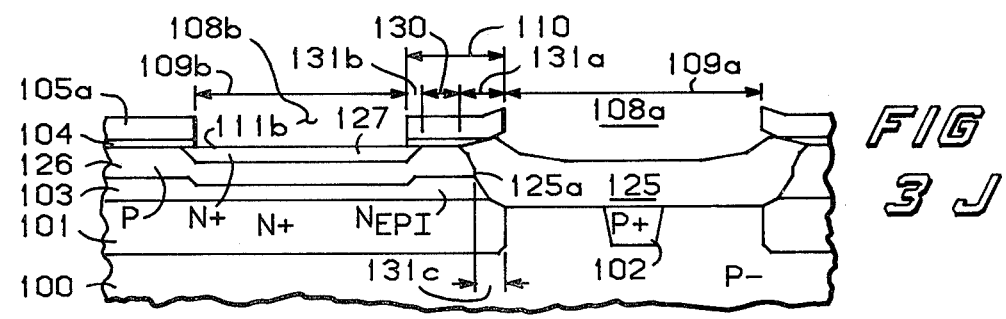

In FIG. 3J, P-base 126 is provided, typically by ion implantation delineated by means of a photoresist mask (not shown). Emitter region 127 is provided by doping silicon surface 111b through opening 108b in layers 104 and 105a. It will be noted that lateral separation 130 between isolation region 125 and device region 127 is determined by distance 110, minus undercut amounts 131a–b. Undercut amounts 131a–b can be readily calculated or determined by experiment for any given sequence of oxide growth, implantation, diffusion or other process steps so that distance 130 can be fixed by choosing a predetermined value of distance 110.

Etch stop layer 105b and selector layer 107a must be differentially etchable in that selector layer 107a must be etchable without substantial etching of etch stop layer 105b. It is desirable but not essential that etch stop layer 105b be etchable without substantial etching of sub-master-mask layer 105a, that masking layer 107b be etchable without substantial etching of selector layer 107a, and that layers 105a and 107a be etchable without substantial etching of layers 105b and 107b respectively. In the simplest embodiment, layers 104, 105b, and 107b are made from silicon oxide and layers 105a and 107a are made from silicon nitride. However, any combinations of materials satisfying the differential etching criteria will serve as long as their other properties are compatible with the semiconductor and the desired process. Selection of these other properties is within the ability of a person skilled in the art.

Using the proper combination of oxide and nitride or equivalent materials for layers 105 and 107 permits differential etching so that different regions of the substrate surface may be protected or exposed through the master-mask layer. Layers 104, 105, and 107 must have the proper relative thicknesses. In this embodiment, layer 104 is a sub-layer to first nitride layer 105a, and acts as a buffer between the nitride and the silicon surface. It does not of itself provide any masking functions. It must have a thickness of at least 50 Å ($5 \times 10^{-9}$ m). It may be as thick as several tenths of a micron, but no advantage is gained thereby. 200 Å ($2 \times 10^{-8}$ m) was found to be a convenient value. Sub-master-masking layer 105a of silicon nitride must have sufficient thickness to resist, that is, be substantially impervious to whatever device forming processes are required. For dielectrically isolated structures it must act both as an oxidation mask during the formation of region 125 and as a diffusion, implantation, or alloying barrier during doping or metallizing of the silicon to produce device region (e.g. emitter) 127, since at that point in the process, substantially all of the overlying oxide (layers 105b and 107b) has been removed. A useful range of nitride thickness for layer 105a is 500-3000 Å ($0.5-3 \times 10^{-7}$ m), with 1500 Å ($1.5 \times 10^{-7}$ m) being convenient. Silicon oxide layer 105b provides an etch stop to protect nitride masking layer 105a when overlying nitride layer 107a is being removed. It must be thick enough to provide this protection. A minimum thickness of 500 Å ($5 \times 10^{-8}$ m) is useful with 1000 Å ($10 \times 10^{-8}$ m) being a convenient value. There is no further benefit in oxide (etch stop) layer 105b being thicker than several thousand Angstroms. Layer 105b is partly etched when oxide buffer layer 104 is removed by non-patterned etching. Thus, it is generally desirable that etch-stop layer 105b be at least as thick as buffer layer 104. Nitride (selector) layer 107a must be sufficiently thick to protect oxide (etch stop) layer 105b during etching of second (selector) pattern 120 and to resist, that is, to be substantially impervious to whatever device forming processes are required. For dielectrically isolated structures selector layer 107a must prevent oxidation of silicon surface 111b in opening 108b during the formation of region 125 in opening 108a. Thickness in the range 500-5000 Å ($5-50 \times 10^{-8}$ m) is useful for layer 107a, with 1500 Å ($15 \times 10^{-8}$ m) being convenient.

In order to facilitate formation of (selector) pattern 120 in nitride (selector) layer 107a, it is desirable to cover layer 107a with mask layer 107b of silicon oxide. 200 Å ($2 \times 10^{-8}$ m) is a convenient thickness for layer 107b, although larger or smaller thicknesses will serve so long as the thickness is adequate to serve as an etch resistant mask. This allows pattern 120 to be first formed in oxide layer 107b using well known organic resist and oxide etching techniques. Layer 107b can then serve as a mask for etching selector layer 107a with reagents that would otherwise attack and remove organic resists. Etching reagents containing HF are convenient for etching oxide layers 104, 105b, and 107b, and etching reagents containing phosphoric acid are convenient for etching nitride layers 105a and 107a. Wet chemical, reactive plasma, or ion beam etching can be used, provided that the etching is sufficiently selective so that oxide may be used as a mask for etching nitride, the nitride (oxidation and doping resistant layers) may be used as a mask for etching the oxide, and both may be used as a mask for etching the semiconductor. Non-patterned etching of oxide and nitride can be performed by wet chemical dip etching, but other methods having the selectivity described above can also serve. Use of oxide layers 105b and 107b to provide etch masks for etching nitride layers 105a and 107a is convenient because it permits patterns 108 and 120 to be first delineated, respectively, in oxide layers 105b and 107b using organic resists. The patterned oxide layers than act as masks for etching nitride layers 105a and 107a with relatively faste etchants (e.g. phosphoric acid) which cannot be used directly with organic resists. However, it is possible, though less convenient to etch layer 107a directly through an organic resist layer as a mask, so that in an alternative embodiment of the invention, layer 107b may be omitted.

Buffer layer 104 is convenient when working with silicon substrates and a first pattern forming (master-mask) layer comprising silicon nitride. However, the buffer layer itself performs no masking functions, and it is possible to build self-aligned structures in an alternative embodiment in which buffer layer 104 is omitted.

It will be noted that sub-master-mask layer 105a and selector layer 107a serve as etch masks during removal of buffer layer 104 and etching of moat 124. When layer 104 and moat 124 are not present or not required to be etched, then layers 105a and 107a need not be resistant to such etching.

It will be recognized by those of skill in the art that the invented layer configuration and process is useful for the production of any self-aligned device structure where the available masking materials provide a selectively etchable pair of materials useful for the selective opening of the self-aligned pattern, but where only one material has the property of being resistant to the device formation and processing steps (e.g. oxidation, doping, metallization, annealing, alloying, epitaxial growth, polycrystalline layer growth or deposition, etching, and combinations thereof) needed to create one or more of the desired device regions. In the illustrated embodiments, silicon nitride performed as the masking material for the device formation steps and silicon oxide as the masking material for placing and/or selecting the masking patterns in the nitride. These material choices are particularly convenient for use with silicon and other common semiconductor substrates. However, other material such as metals, semiconductors, other refractory oxides and nitrides, or combinations thereof can be used provided that they can be selectively etched, that at least one material is resistant (i.e. substantially impervious) to all the desired device forming operations which must be self-aligned through a single masking layer, and that they are otherwise compatible with the basic device materials.

It will be apparent to those of skill in the art that the method and material combination described above provide an improved self-aligned process for the manufacture of semiconductor devices, integrated circuits and other electronic devices. Further, it is apparent that this process provides for a significant reduction in lateral device area and cost, and accomplishes this without additional masking steps or critical alignments, and with non-walled dielectrically isolated emitter structures, thereby avoiding a significant source of manufacturing yield loss associated with prior art methods. It is additionally apparent that self-alignment of critical device regions, particularly emitters, and emitter, base and collector contacts with respect to each other and other dielectric isolation regions, is automatically obtained. It is further apparent that improved devices are provided by the practice of the method of this invention.

Those of skill in the art will also recognize that many varations can be made on the processes of this invention without departing from the spirit and scope of this invention. In particular, this technique can be applied to devices employing other substrate materials besides semiconductors where precise alignment and/or location of device regions and/or oxidized regions with respect to each other is important. Examples of these are Josephson devices, bubble memory devices, and devices where various precision dielectric and metal regions are desired to be formed. It is also readily apparent to those of skill in the art that many other semiconductor device types besides the bipolar transistors illustrated may be formed by employing the method of this invention. Examples are field effect devices, unijunction devices, thyristors, IMPATT devices, pressure sensors, temperature sensors, gas detectors, and optoelectric and acoustic devices. Accordingly, it is intended to encompass all such variations.

We claim:

1. A method for fabricating at least two self-aligned device regions in a substrate, comprising:

providing a sub-master-mask layer on said substrate of a first material resistant to device forming processes;

providing an etch stop layer on said sub-master-mask layer of a second material different from said first material;

patterning said etch stop layer and said sub-master-mask layer to provide at least two openings having location and shape substantially corresponding to said at least two self-aligned device regions and penetrating to and exposing said substrate in said openings;

providing a selector layer covering said etch stop layer and said substrate exposed in said opening, said selector layer being of a third material resistant to oxidation and differentially etchable with respect to said second material so that portions of said selector layer can be removed without substantially attacking said etch stop layer;

patterning said selector layer to provide at least one aperture larger than and encompassing a first of said at least two openings to re-expose said substrate in said first opening;

applying a first of said device forming processes to form a first device region in said first opening;

removing, without use of a patterning step, said selector layer in a second of said at least two openings so as to re-expose said substrate in said second opening; and applying a second of said device forming processes to form a second device region in said second opening.

2. A method for forming in a surface of a substrate a first device region located a predetermined lateral distance from a second device region, wherein said first device region is a dielectric isolation region, comprising:

applying to said surface a first pattern forming layer substantially impervious to oxidation and doping of said surface;

forming a first pattern to said first pattern forming layer having at least two openings to said surface separated by said predetermined lateral distance plus predetermined first and second undercut amounts, a first of said at least two openings corresponding within said first undercut amount to said first device region, and a second of said at least two openings corresponding within said second undercut amount to said second device region;

applying over said first pattern forming layer and in said openings to said surface so as to substantially coat said surface, a second pattern forming layer substantially impervious to oxidation of said surface;

forming a second pattern in said second pattern forming layer, said second pattern having a third opening larger than and substantially encompassing said first opening so as to re-expose said surface in said first opening;

creating said first device region in said surface under said first opening;

removing without use of a mask said second pattern forming layer so as to re-expose said surface in said second opening; and creating said second device region in said surface through said second opening.

3. The method of claim 2 further comprising fashioning a buffer layer between said surface of said substrate and said first pattern forming layer, removing a first portion of said buffer layer corresponding to said first opening prior to said first creating step, and removing a second portion of said buffer layer corresponding to said second opening prior to said second creating step.

4. The method of claim 2 wherein said first applying step for applying said first pattern forming layer further comprises providing two material layers, a first material layer of a first material, a second material layer of a second material on said first material layer of said first material, wherein said first and second material layers together serve as said first pattern forming layer, wherein said first and second materials have different etching characteristics so that one may be etched without substantially etching the other, and wherein said first material is substantially impervious to oxidation and doping and said second material is substantially impervious to etching of said first material.

5. The method of claim 4 wherein said first material comprises silicon nitride and said second material comprises silicon oxide.

6. The method of claim 4 wherein said second applying step for applying said second pattern forming layer further comprises utilizing said first material in said second pattern forming layer.

7. The method of claim 6 wherein said first material comprises silicon nitride and said second material comprises silicon oxide.

8. A method for forming in a substrate surface at least one device region located a predetermined distance from an oxide isolation region in the same surface, comprising:

applying a first pattern forming layer to said substrate surface, said first pattern forming layer comprising a first layer of a first material covered by a second layer of a second material, said first and second materials having different etching characteristics to permit each to be etched substantially without removing the other and said first material being substantially resistant to oxidation and doping;

forming a first pattern in said first pattern forming layer having at least two openings to said substrate surface separated by said predetermined lateral distance, plus an undercut amount, a first of said at least two openings corresponding within said undercut amount to said oxide isolation region and a second opening corresponding to said device region;

applying a second pattern forming layer resistant to oxidation over said first pattern forming layer and in said openings to said substrate surface so as to substantially coat said surface, said second pattern forming layer comprising said first material;

forming a second pattern in said second pattern forming layer having a third opening larger than and substantially encompassing said first opening so as to re-expose said substrate surface in said first opening;

creating said oxide isolation region in said substrate surface under said first opening;

removing said second pattern forming layer by substantially uniform etching to re-expose said substrate surface in said second opening; and doping said substrate surface through said opening to form said at least one device region.

9. The method of claim 8 wherein said first applying step further comprises forming a buffer layer of said second material underlying said first layer of said first material, wherein said first forming step further comprises limiting said first pattern so as to penetrate said first pattern forming layer to said buffer layer and leaving said buffer layer on said substrate surface, wherein said second applying step further comprises applying said second pattern forming layer on said buffer layer instead of said substrate surface, wherein said second forming step further comprises removing said buffer layer to re-expose said substrate surface in said first opening, and wherein said removing step further comprises removing said buffer layer in said second opening to re-expose said substrate surface.

* * * * *